(12) United States Patent
Shimomaki

(10) Patent No.: US 9,496,834 B2
(45) Date of Patent: Nov. 15, 2016

(54) OPERATIONAL AMPLIFYING CIRCUIT AND LIQUID CRYSTAL PANEL DRIVE DEVICE USING THE SAME

(71) Applicant: RENESAS ELECTRONICS CORPORATION, Kawasaki-shi, Kanagawa (JP)

(72) Inventor: Kenji Shimomaki, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 14/828,893

(22) Filed: Aug. 18, 2015

(65) Prior Publication Data

US 2015/0356941 A1    Dec. 10, 2015

Related U.S. Application Data

(63) Continuation of application No. 13/305,159, filed on Nov. 28, 2011, now Pat. No. 9,143,102.

(30) Foreign Application Priority Data

Nov. 29, 2010  (JP) .................. 2010-265046
Sep. 30, 2011  (JP) .................. 2011-217040

(51) Int. Cl.
 *G09G 3/36* (2006.01)
 *H03F 3/45* (2006.01)

(52) U.S. Cl.
 CPC ........ *H03F 3/45219* (2013.01); *G09G 3/3688* (2013.01); *G09G 2310/0291* (2013.01); *G09G 2310/08* (2013.01); *H03F 2203/45248* (2013.01); *H03F 2203/45461* (2013.01)

(58) Field of Classification Search
 None
 See application file for complete search history.

(56) References Cited

U.S. PATENT DOCUMENTS

| 7,652,538 B2 | 1/2010 | Choi |
| 7,863,982 B2 | 1/2011 | Chen et al. |
| 7,907,011 B2 | 3/2011 | Chung |
| 8,044,950 B2 | 10/2011 | Satou |
| 8,184,083 B2 | 5/2012 | Chung |
| 2003/0160749 A1 | 8/2003 | Tsuchi |
| 2010/0033250 A1 | 2/2010 | Shimatani |

FOREIGN PATENT DOCUMENTS

| JP | 2006-094534 A | 4/2006 |
| JP | 2006-119364 A | 5/2006 |
| JP | 2007-149207 A | 6/2007 |
| JP | 2007-208316 A | 8/2007 |
| JP | 2008-211623 A | 9/2008 |

*Primary Examiner* — Seokyun Moon
(74) *Attorney, Agent, or Firm* — Foley & Lardner LLP

(57) ABSTRACT

An operational amplifier circuit includes: a first differential amplifier section containing a P-type differential pair of P-type transistors; a second differential amplifier section containing an N-type differential pair of N-type transistors; an intermediate stage connected with outputs of the first and second differential amplifier sections and containing a first current mirror circuit of P-type transistors, and a second current mirror circuit of N-type transistors; and an output stage configured to amplify an output of the intermediate stage in power. The first differential amplifier section includes a first current source and a first capacitance between sources of the P-type transistors of the P-type differential pair and a positive side power supply voltage. The second differential amplifier section includes a second current source and a second capacitance between sources of the N-type transistors of the N-type differential pair and a negative side power supply voltage.

4 Claims, 4 Drawing Sheets

OPERATIONAL AMPLIFYING CIRCUIT AND LIQUID CRYSTAL PANEL DRIVE DEVICE USING THE SAME

CROSS-REFERENCE

This application is a continuation of U.S. application Ser. No. 13/305,159, filed Nov. 28, 2011, which claims benefit of priority from the prior Japanese Application Nos. JP2010-265046 and JP2011-217040, filed on Nov. 29, 2010 and Sep. 30, 2011, respectively. The entire contents of all of which are incorporated herein by reference.

TECHNICAL FIELD

The present invention is related to an operational amplifier circuit, and particularly an operational amplifier circuit used for a liquid crystal panel drive device.

BACKGROUND ART

In recent years, products using a liquid crystal panel such as a television receiver, a mobile phone, and a handheld terminal are increasing. Also, the demand of the large-sized thin flat panel is increasing. In a semiconductor integrated circuit for controlling the display of the liquid crystal panel, a high-speed operation is required to realize double speed drive to reduce a residual image in the display of an image and to allow smooth change of the image, in addition to realization of a 3D (3-dimensional) image.

A technique of an operational amplifier improve a slew rate is disclosed in Patent Literature 1 (JP 2006-094534A). The operational amplifier is provided with a first supply voltage rail section, a second supply voltage rail section, an input stage, a folded cascade connection stage, an output driver stage and a compensation circuit. The input stage includes a first input terminal and a second input terminal. The folded cascade connection stage is provided with first to fourth nodes and is connected to an output of the input stage. The output driver stage is provided with first and second output transistors which are respectively connected to the first and second nodes of the folded cascade stage, and outputs a drive current to an output node of the operational amplifier. The compensation circuit is provided with first and second capacitors, and first to fourth switches and is connected to the third and fourth nodes of the folded cascade connection stage and the output node of the operational amplifier. The output node is connected to the second input terminal of the input stage. The first switch and the first capacitor are connected in series between the first supply voltage rail section and the output node. The second switch and the second capacitor are connected in series between the second supply voltage rail section and the output node. The third switch is connected to the third node of the folded cascade connection stage between the first switch and the first capacitor. The fourth switch is connected to the fourth node of the folded cascade connection stage between the second switch and the second capacitor. Moreover, the compensation circuit is provided with the third capacitor between the third node of the folded cascade connection stage and the output node, and is provided with the fourth capacitor between the fourth node of the folded cascade connection stage and the output node.

In this way, the above-mentioned operational amplifier has phase compensation capacitors which are connected in parallel to improve a slew rate. In the section in which the output voltage changes, only the one of the phase compensation capacitors connected in parallel is used. Therefore, there is a fear that the amplification operation becomes instable.

CITATION LIST

[Patent Literature 1]: JP 2006-094534A

SUMMARY OF THE INVENTION

The present invention provides an operational amplifier circuit, and a liquid crystal panel drive device using the same, which improves a slew rate while operating stably.

In an aspect of the present invention, an operational amplifier circuit includes: a first differential amplifier section containing a P-type differential pair of P-type transistors; a second differential amplifier section containing an N-type differential pair of N-type transistors; an intermediate stage connected with outputs of the first and second differential amplifier sections and containing a first current mirror circuit of P-type transistors, and a second current mirror circuit of N-type transistors; and an output stage configured to amplify an output of the intermediate stage in power. The first differential amplifier section includes a first current source and a first capacitance between sources of the P-type transistors of the differential pair and a positive side power supply voltage. The second differential amplifier section includes a second current source and a second capacitance between sources of the N-type transistors of the N-type differential pair and a negative side power supply voltage.

In another aspect of the present invention, the liquid crystal driver circuit is provided with a buffer circuit in which the above operational amplifier circuit is connected to configure a voltage follower; and a gray-scale voltage generating circuit configured to generate a gray-scale voltage based on an input signal to output to said buffer circuit.

According to the present invention, the operational amplifier circuit and the liquid crystal panel drive device using the same are provided improve a slew rate while operating stably.

DESCRIPTION OF EMBODIMENTS

Hereinafter, a liquid crystal display which uses a liquid crystal drive device using an operational amplifier circuit according to the present invention will be described with reference to the drawings.

Figure 1:
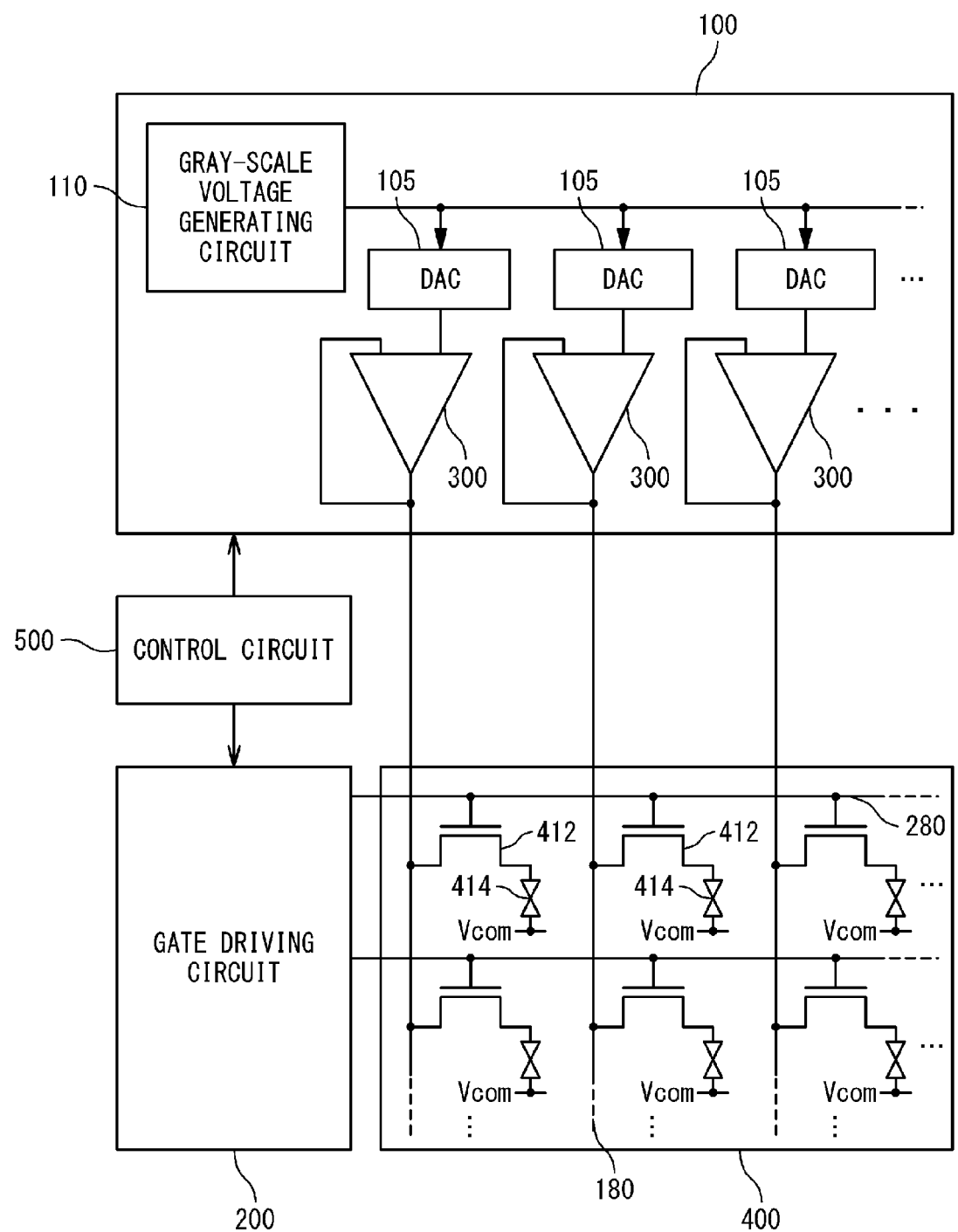
FIG. 1 is a diagram schematically showing a configuration of a liquid crystal display according to an embodiment of the present invention.

FIG. 1 is a diagram schematically showing the configuration of the liquid crystal display according to an embodiment of the present invention. The liquid crystal display is provided with a source drive circuit (a source driver) 100, a gate drive circuit (a gate driver) 200, a display panel 400 and a control circuit 500. The control circuit 500 controls the operation timings of the source drive circuit 100 and the gate drive circuit 200 based on a signal supplied externally. The display panel 400 is provided with TFTs (Thin Film Transistors) 412 and liquid crystal capacitances 414, which are arranged in a matrix. The source drive circuit 100 drives a data line 180 connected with the TFTs 412 in a column direction of the display panel 400. The gate drive circuit 200 drives a scanning line 280 connected with the TFTs 412 in a row direction of the display panel 400. The source drive circuit 100 is provided with a gray-scale voltage generating circuit 110, D/A conversion circuits (DACs) 105 and buffer circuits, each of which contains an operational amplifier circuit 300. The D/A conversion circuit 105 carries out a D/A conversion based on a gray-scale voltage which is generated by a gray-scale voltage generating circuit 110. Power is amplified by the buffer circuit (the operational amplifier circuit 300 has a voltage follower connection) and a signal subjected to the D/A conversion is supplied to the data line 180.

Figure 2:
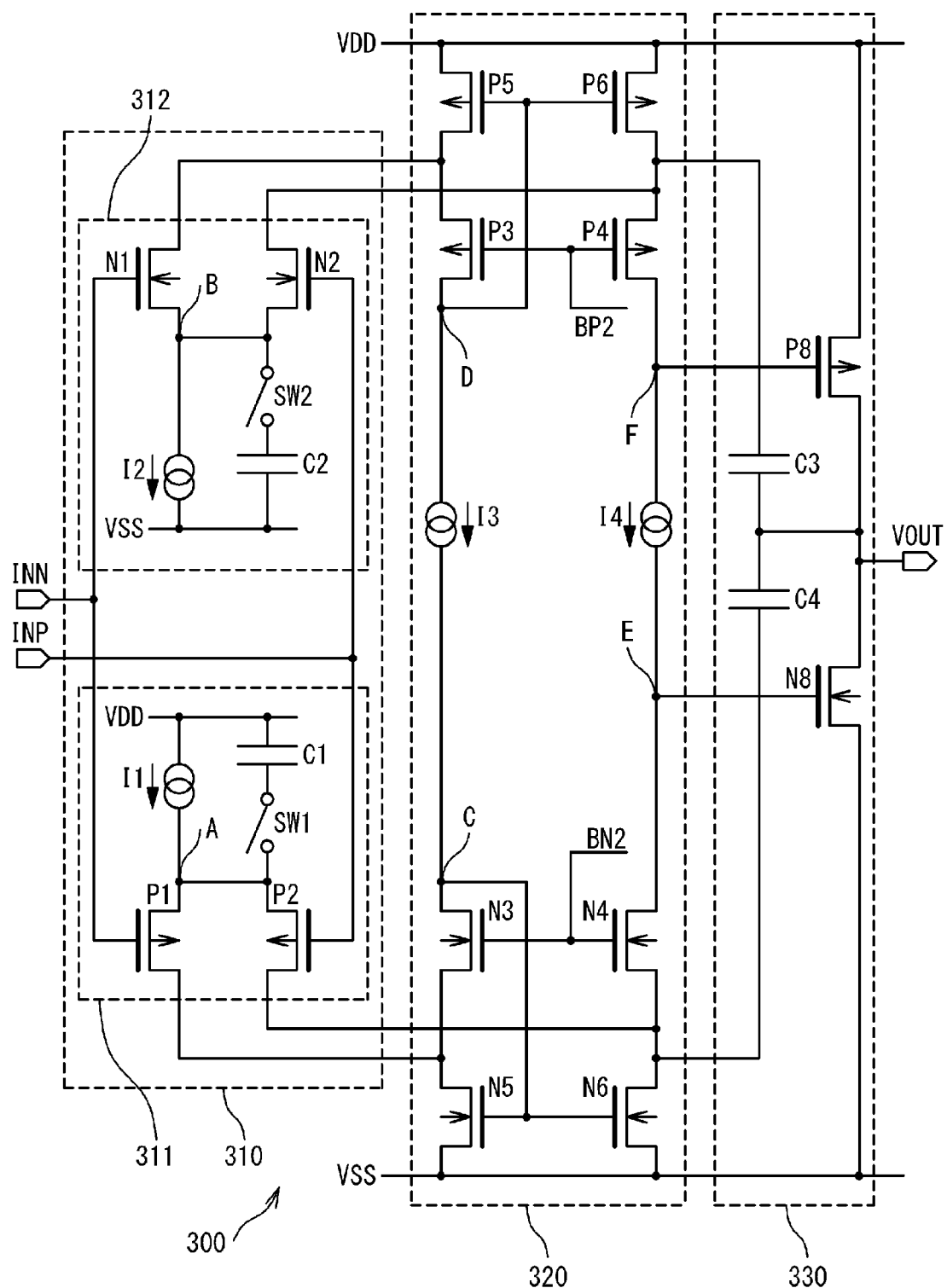
FIG. 2 is a diagram showing the configuration of an operational amplifier circuit according to the embodiment of the present invention.

The operational amplifier circuit 300 is a Rail-to-Rail folded cascade connected differential amplifying circuit which is provided with a differential stage 310, an intermediate stage 320, and an output stage 330, as shown in FIG. 2.

The differential stage 310 is provided, with a differential amplifier 311 which contains P-type transistors and a differential amplifier 312 which contains N-type transistors. The differential amplifier 311 is provided with P-type transistors P1 and P2 for a differential pair, a constant current source I1, a capacitance C1 and a switch SW1. The capacitance C1 and the switch SW1 are connected in series between sources (node A) of the P-type transistors P1 and P2 connected in common and a positive side power supply voltage VDD, and the constant current source I1 is connected in parallel to the series connection of the capacitance C1 and the switch SW1. The differential amplifier 312 is provided with the N-type transistors N1 and N2 for a differential pair, a constant current source I2, a capacitance C2 and a switch SW2. The capacitance C2 and the switch SW2 are connected in series between sources (node B) of the N-type transistors N1 and N2 connected in common and a negative side power supply voltage VSS, and the constant current source I2 is connected in parallel to the series connection of the capacitance C2 and the switch SW2.

The gate of the P-type transistor P1 and the gate of the N-type transistor N1 are connected with an inversion input node INN. The gate of the P-type transistor P2 and the gate of the N-type transistor N2 are connected with a non-inversion input node INP. The switches SW1 and SW2 carry out a switching operation in response to a control signal outputted from the control circuit 500.

The intermediate stage 320 is provided with a current mirror circuit which contains P-type transistors P3 to P6, a current mirror circuit which contains N-type transistors N3 to N6, and constant current sources I3 and I4. The P-type transistor P3 to P6 forms a current mirror circuit. The P-type transistors P5 and P3 are connected in series between the positive side power supply voltage VDD and the constant current source I3, and, the P-type transistors P6 and P4 are connected in series between the positive side power supply voltage VDD and the constant current source I4. The gate of the P-type transistor P3 and the gate of the P-type transistor P4 are connected and a bias voltage BP2 is applied thereto. The gate of the P-type transistor P5 and the gate of the P-type transistor P6 are connected with a connection node D between the drain of the P-type transistor P3 and the constant current source I3. A connection node F between the drain of the P-type transistor P4 and the constant current source I4 is connected with the gate of output transistor P8. The drain of the N-type transistor N1 of the differential amplifier 312 is connected with a connection node between the drain of the P-type transistor P5 and the source of the P-type transistor P3. The drain of the N-type transistor N2 of the differential amplifier 312 is connected with a connection node between the drain of the P-type transistor P6 and the source of the P-type transistor P4.

The N-type transistors N3 to N6 form a current mirror circuit. The N-type transistors N5 and N3 are connected in series between the negative side power supply voltage VSS and the constant current source I3, and the N-type transistors N6 and N4 are connected in series between the negative side power supply voltage VSS and the constant current source I4. The gate of the N-type transistor N3 and the gate of the N-type transistor N4 are connected and a bias voltage BN2 is applied thereto. The gate of the N-type transistor N5 and the gate of the N-type transistor N6 are connected a connection node C between the drain of the N-type transistor N3 and the constant current source I3. A connection node E between the drain of the N-type transistor N4 and the constant current source I4 is connected with the gate of the output transistor N8. The drain of the P-type transistor P1 of the differential amplifier 311 is connected with a connection node between the drain of the N-type transistor M5 and the source of the N-type transistor N3. The drain of the P-type transistor P2 of the differential amplifier 311 is connected with a connection node between the drain of the N-type transistor MG and the source of the N-type transistor N4. The constant current origin I3 is provided between the node D and the node C as a floating current source. The constant current source I4 is provided between the node F and the node E as a floating current source.

The output stage 330 is provided with output transistors P8 and N8 and phase compensation capacitances C3 and C4. The output transistors PB and NB are connected in series between the positive side power supply voltage VDD and the negative side power supply voltage VSS. A connection node between the drain of output transistor P8 and the drain of output transistor N8 functions as an output node VOUT.

The phase compensation capacitance C3 is connected between the connection node of the drain of the P-type transistor P6 and the source of the P-type transistor P4 and the output node VOUT. The phase compensation capacitance C4 is connected between the connection node of the drain of the N-type transistor N6 and the source of the N-type transistor N4 and the output node VOUT.

Figure 3:
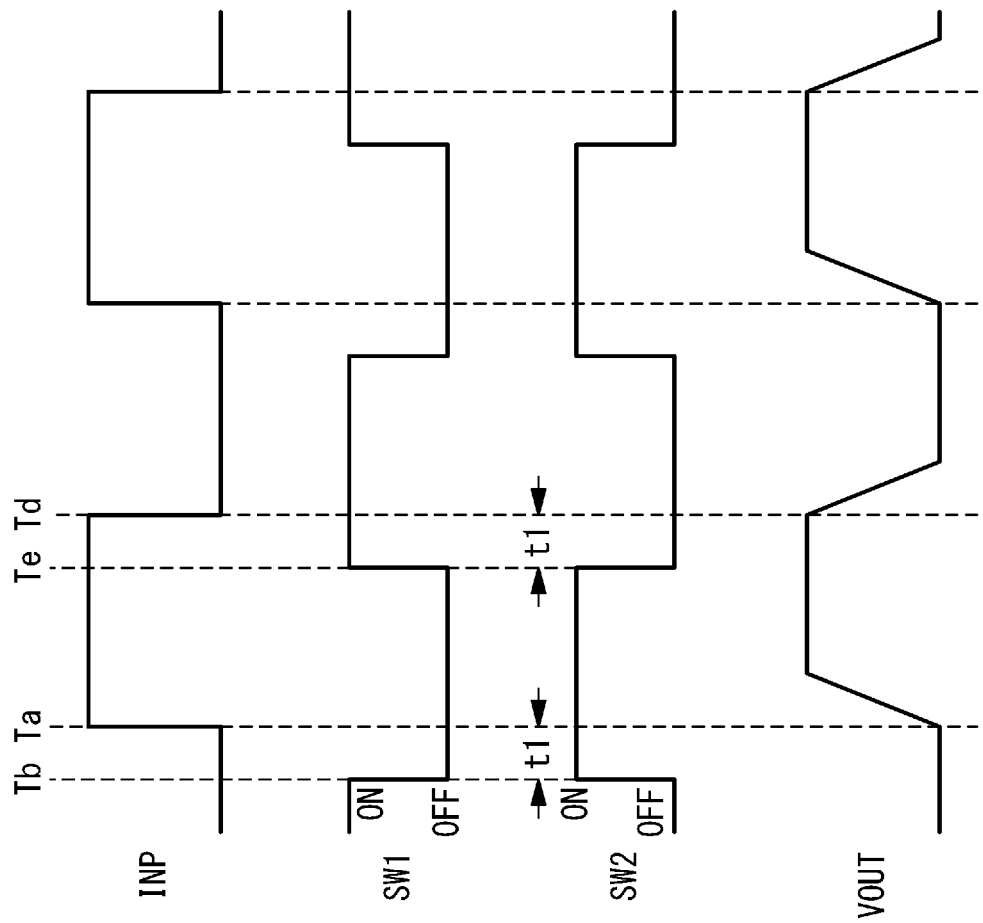
FIG. 3A to FIG. 3D show timing charts an operation of the operational amplifier circuit, according to the embodiment of the present invention.

Moreover, referring to FIG. 3, an operation of the operational amplifier circuit 300 according to the present embodiment will be described.

The output node VOUT is connected with the inversion input node INN. That is, the operational amplifier circuit 300t will be described as a voltage follower. Also, as shown in FIG. 3A, the description will be given under a condition that a signal rising from the VSS is supplied to the non-inversion input node INP of the operational amplifier circuit 300 at time Ta as an input voltage. At this time, the differential amplifier 312 switches from an OFF state to an ON state. Contrary to this, the differential amplifier 311 which is provided with the P-type transistors switches from the ON state to the OFF state as the voltage of the signal applied to the non-inversion input node INP becomes high.

At time Tb by a time period t1 before the time Ta at which the signal applied to the non-inversion input node INP rises, the control circuit 500 outputs a control signal to close the switch SW2 of the differential amplifier 312 (FIG. 3C). Moreover, when the switch SW2 is closed, the node B is connected with the negative side power supply voltage VSS through the capacitance C2. That is, the sources (node B) of the N-type transistors N1 and N2 which are connected in common are connected with the negative side power supply voltage VSS through the constant current source I2 which is connected in parallel to the capacitance C2. At this time, because the signal applied to the non-inversion input node INP is still a low voltage, the differential amplifier 312 is in an OFF state and the node B has a voltage in the neighborhood of the negative side power supply voltage VSS. Therefore, the charge of the capacitance C2 is discharged through the constant current source I2 from the node B. The time period t1 is a period to discharge from the capacitances C1 and C2. When the time period t1 is too short, the discharging becomes insufficient and the effect of the present invention is insufficient. When the time period t1 is too long, an influence appears on the signal waveform. When being applied to a drive circuit of a display unit, it sometimes causes the degradation of the image quality. It is desirable that the time period t1 is a necessary and minimum time to discharge.

After that, when the voltage of the non-inversion input node INP rises at the time Ta, the differential amplifier 312 begins to operate and the electric charge stored in the phase compensation capacitance C3 flows into the capacitance C2. Therefore, a current which flows through the node B of the differential amplifier 312 is more than a current which flows through the constant current source I2. When supposing that a capacitance value of the phase compensation capacitance is C3 and a current which flows through the node B of the differential amplifier 312 is I, a slew rate (=SR) is calculated from SR=I/C. Therefore, when the switch SW2 is closed so that the current I which flows through the node B increases, the slew rate is improved (FIG. 3D).

When the signal applied to the non-inversion input node INP falls from the VDD to the VSS, the operations of the P-type transistor and the N-type transistor are exchanged. That is, the differential amplifier 312 is switched from the ON state to the OFF state and the differential amplifier 311 is switched from the OFF state to the ON state.

At time Te by the time period t1 before time Td which the signal applied to the non-inversion input node INP falls, the control circuit 500 outputs a control signal to close the switch SW1 of the differential amplifier 311 (FIG. 3B). Moreover, when the switch SW1 is closed, the node A is connected with the positive side power supply voltage VDD through the capacitance C1. That is, the sources (node A) of the P-type transistors P1 and P2 which are connected in common are connected with the positive side power supply voltage VDD through the constant current source I1 and the capacitance C1 which are connected in parallel. At this time, because the signal applied to the non-inversion input node INP is still high voltage, the differential amplifier 311 is in an OFF state and the node A is in a voltage in the neighborhood of the positive side power supply voltage VDD. Therefore, the electric stored in the capacitance C1 is discharged through the constant current source I1 from the node A.

After that, when the voltage of the non inversion input, node INP falls at time Td, the differential amplifier 311 begins to operate and the charge stored in the phase compensation capacitance C4 flows into the capacitance C1. Therefore, a current which flows through the node A of the differential amplifier 311 is more than a current which flows through the constant current source I1. Therefore, when the switch SW1 is closed so that the current I which flows through the node A increases, the slew rate (SR=I/C) is improved (FIG. 3D).

In this way, because the phase compensation capacitances C3 and C4 are fixed and operated, the operational amplifier circuit 300 operates in a stable condition and the slew rate can be improved. Generally, the amplifier circuit operates stably when the capacitance value of the phase compensation capacitance is large. However, the slew rate SR reduces as the capacitance value C of the phase compensation capacitance increases because the slew rate SR is determined from SR=I/C. In the present invention, the capacitances C1 and C2 and the switches SW1 and SW2 are provided in parallel with the constant current sources I1 and I2 in the differential stage 310, respectively. The switches SW1 and SW2 are controlled by the control circuit 500 to increase current temporarily, which improves the slew rate. Therefore, the operational amplifier circuit 300 operates stably and the slew rate can be improved.

Figure 4:
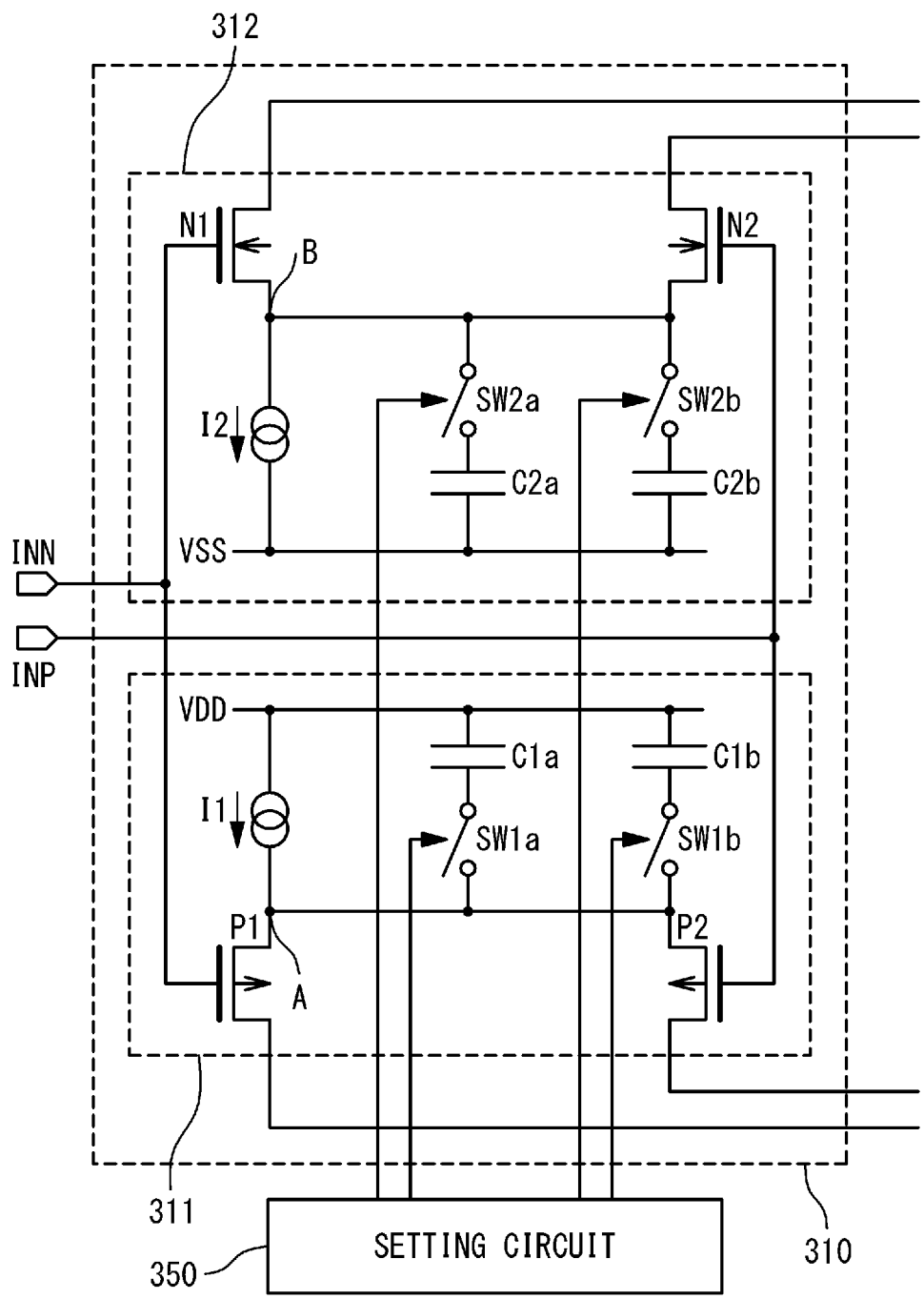
FIG. 4 is a diagram showing the configuration of the operational amplifier circuit according to another embodiment of the present invention.

As shown in FIG. 4, each of the capacitance C1 and the capacitance C2 may be divided into a plurality of capacitances and be controlled. In this example, the capacitance C1 is divided into capacitances C1a and C1b, and switches SW1a and SW1b are connected in series with them, respectively. Also, the capacitance C2 is divided into capacitance C2a and C2b and switches SW2a and SW2b are connected in series with them, respectively. Therefore, the capacitance value of the capacitance C1 can be shown as a synthetic capacitance value of the capacitances C1a and C1b and the capacitance value with capacitance C2 can be shown as a synthetic capacitance value of capacitances C2a and C2b. That is, by the controlling the switches SW1a, SW1b, SW2a, and SW2b, the capacitance values of capacitances C1 and C2 can be changed. It is possible to adjust the slew rate to be suitable for the specification, because the slew rate can be changed by use of the capacitance values of the capacitances C1 and C2.

That is, a setting circuit 350 holds data indicating which capacitances of the plurality of capacitances C1a, C1b, C2a, and C2b are used, that is, indicating the closed switches and the opened switches among the switches SW1a, SW1b, SW2a, and SW2b. This data may be held by a register and may be substantially fixedly held by fuses. The data may be written in a non-volatile memory such as a flash memory, or the data may be written in a memory when the memory is installed in an apparatus. If the register is the non-volatile memory as the register, the data can be written immediately before an operation start.

In case of a display drive circuit using many operational amplifier circuits, about 1000 operational amplifier circuits are provided. For this reason, even if the slew rates of operational amplifier circuits are varied, the slew rates can be adjusted. Also, there is a case that the signal waveform becomes dull, depending on a position in which the drive circuit is arranged. In such a case, it is possible to change the slew rate depending on the position so as to decrease a deviation of the waveform of the output signal.

As described above, the embodiments of the present invention have been described but the present invention is not limited to the embodiments. Various modifications may be carried out within the scope of the present invention.

What is claimed is:
1. A display driver that outputs a plurality of output display signals, comprising:
 a gray-scale voltage generating circuit that generates gray-scale voltages based on an input signal; and a plurality of operational amplifiers that outputs the plurality of output display signals based on the gray-scale voltages, each of the operational amplifiers comprising:
a P-channel differential amplifier including a first slew-rate control capacitor and a first switch;
an N-channel differential amplifier including a second slew-rate control capacitor and a second switch; and
an output circuit including:
an output amplifier configured to receive and amplify an initial display signal to provide a respective of the output display signals; and
a first phase compensation capacitor and a second phase compensation capacitor configured to store a first charge and second charge of the initial display signal, respectively, and configured to delay a phase of the initial display signal,
wherein the first switch is configured to transfer the first charge stored in the first phase compensation capacitor to the first slew-rate control capacitor, and
wherein the second switch is configured to transfer the second charge stored in the second phase compensation capacitor to the second slew-rate control capacitor.

2. The display driver according to claim 1,
wherein each of the operational amplifiers further comprises:
an output node coupled to the output circuit, the output node outputs the display signal;
a first input node coupled to the gray-scale generating circuit, the first input node inputs the gray scale voltage; and
a second input node coupled to the output node, the second input node inputs the display signal.

3. The display driver according to claim 2,
wherein each of the operational amplifiers has a voltage follower connection.

4. The display driver according to claim 3,
wherein the P-channel differential amplifier, the N-channel differential amplifier and the output circuit configure a folded cascode type amplifier.

* * * * *